(12) United States Patent
Chang et al.

(10) Patent No.: US 10,128,211 B2
(45) Date of Patent: Nov. 13, 2018

(54) THIN FAN-OUT MULTI-CHIP STACKED PACKAGE STRUCTURE AND MANUFACTURING METHOD THEREOF

(71) Applicant: Powertech Technology Inc., Hsinchu County (TW)

(72) Inventors: Chia-Wei Chang, Hsinchu County (TW); Yong-Cheng Chuang, Hsinchu County (TW); Yu-Tso Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/630,940

(22) Filed: Jun. 22, 2017

(65) Prior Publication Data

US 2018/0211936 A1   Jul. 26, 2018

(30) Foreign Application Priority Data

Jan. 25, 2017  (TW) .............................. 106102928 A

(51) Int. Cl.
*H01L 23/00* (2006.01)
*H01L 23/31* (2006.01)
(Continued)

(52) U.S. Cl.
CPC .............. *H01L 24/96* (2013.01); *H01L 23/16* (2013.01); *H01L 23/3171* (2013.01);
(Continued)

(58) Field of Classification Search
CPC ... H01L 24/96; H01L 23/3171; H01L 23/544; H01L 2924/181
See application file for complete search history.

(56) References Cited

U.S. PATENT DOCUMENTS 9,202,716 B2 * 12/2015 Park .................... H01L 24/96
2007/0170573 A1   7/2007 Kuroda et al.
(Continued)

FOREIGN PATENT DOCUMENTS

TW   200814285   3/2008
TW   201007918   2/2010
(Continued)

*Primary Examiner* — David Vu
(74) *Attorney, Agent, or Firm* — JCIPRNET

(57) ABSTRACT

A thin fan-out multi-chip stacked package structure including a plurality of stacked chips is provided. The electrodes of the stacked chips and the active surface of the top chip are exposed. A dummy spacer and an alignment structure are disposed over the active surface. Each bonding wire has a bonding thread bonded to a chip electrode and an integrally-connected vertical wire segment. A flat encapsulant encapsulates the chip stacked structure and the bonding wires. Polished cross-sectional surfaces of the bonding wires and a surface of the alignment structure are exposed by the flat surface of the encapsulant. A redistribution layer structure is formed on the flat surface. A passivation layer covers the flat surface and exposes the polished cross-sectional surfaces and the alignment structure. Fan-out circuits are formed on the passivation layer and are connected to the polished cross-sectional surfaces of the bonding wires and the alignment structure.

22 Claims, 17 Drawing Sheets

(51) Int. Cl.
  *H01L 23/544* (2006.01)
  *H01L 23/16* (2006.01)
  *H01L 21/56* (2006.01)

(52) U.S. Cl.
  CPC .......... *H01L 23/544* (2013.01); *H01L 21/568* (2013.01); *H01L 23/3128* (2013.01); *H01L 2223/54426* (2013.01); *H01L 2223/54486* (2013.01); *H01L 2924/181* (2013.01)

(56) References Cited

U.S. PATENT DOCUMENTS

2013/0017643 A1   1/2013   Lin et al.
2015/0069632 A1   3/2015   Ozawa

FOREIGN PATENT DOCUMENTS

TW   201347138   11/2013
TW   I567897   1/2017

\* cited by examiner

THIN FAN-OUT MULTI-CHIP STACKED PACKAGE STRUCTURE AND MANUFACTURING METHOD THEREOF

CROSS-REFERENCE TO RELATED APPLICATION

This application claims the priority benefit of Taiwan application serial no. 106102928, filed on Jan. 25, 2017. The entirety of the above-mentioned patent application is hereby incorporated by reference herein and made a part of this specification.

BACKGROUND OF THE INVENTION

Field of the Invention

The disclosure relates to the field of semiconductor chip packaging, and more particularly, to a thin fan-out multi-chip stacked package structure and a manufacturing method thereof.

Description of Related Art

In the known multi-chip stack package structure, a plurality of semiconductor chips are stacked upward on a substrate one by one. The active surfaces of the chips face upward and the complete bonding wires formed by wiring bonding electrically connect the chips to the substrate. In general, the bonding threads of the bonding wires are bonded to bonding pads of the chips, the wire ends of the bonding wires are bonded to contact fingers of the substrate, and the wire segments of the bonding wires are arc-shaped. However, the multi-chip stack package structure formed by this method would at least require the thickness of the substrate and the height of the wiring arc. In other words, the total thickness of the multi-chip stack package structure cannot be reduced. In particular, in situations requiring long bonding wires, issues such as short-circuit caused by wire sweep may occur easily during the step of forming an encapsulant.

SUMMARY OF THE INVENTION

To solve the above issue, the disclosure provides a thin fan-out multi-chip stacked package structure and a manufacturing method thereof capable of alleviating the issue of wire sweep of vertical bonding wires in a specific package type during encapsulation process. Moreover, the disclosure also incorporated alignment structure into the thin fan-out multi-chip stacked package structure and a manufacturing method thereof, so the precision during manufacturing process may be enhanced. Therefore, the fabrication of the thin fan-out multi-chip stacked package structure would result in better stability and yield.

The disclosure discloses a thin fan-out multi-chip stacked package structure including a chip stack, a dummy spacer, an alignment structure, a plurality of bonding wires, an encapsulant, and a redistribution layer structure. The chip stack is formed by stacking a plurality of chips. Each of the chips has an active surface and at least one electrode located on the active surface. At least one electrode of a first chip is exposed by a second chip. The dummy spacer is disposed on the active surface of the second chip. At least one electrode of the second chip is exposed by the dummy spacer. The alignment structure is over the active surface of the second chip. Each of the bonding wires has a bonding thread and a vertical wire segment. The bonding threads of the bonding wires are bonded to the electrodes of the chips and are integrally connected to the corresponding vertical wire segment. The encapsulant encapsulates the chip stack and the bonding wires. The encapsulant has a flat surface. A plurality of polished cross-sectional surfaces of the bonding wires and the alignment structure are coplanarly exposed by the flat surface. The redistribution layer structure is formed on the flat surface. The redistribution layer structure includes a plurality of fan-out circuits, a first passivation layer, and a second passivation layer. The first passivation layer covers the flat surface and exposes the polished cross-sectional surfaces of the bonding wires and the alignment structure. The fan-out circuits are formed on the first passivation layer and are connected to the polished cross-sectional surfaces of the bonding wires and the alignment structure via openings of the first passivation layer. The second passivation layer is formed on the first passivation layer and covers the fan-out circuits.

The disclosure also discloses a manufacturing method of the thin fan-out multi-chip stacked package structure. The manufacturing method includes at least the following steps. First, a chip stack is provided on a temporary carrier plate. The chip stack is formed by stacking a plurality of chips, each of the chips has an active surface and at least one electrode located on the active surface. At least one electrode of a first chip is exposed by a second chip. Subsequently, a dummy spacer and an alignment structure are formed over the active surface of the second chip. At least one electrode of the second chip is exposed by the dummy spacer. A plurality of first bonding wires are connected between the chip stack and the dummy spacer. Each of the first bonding wires has a bonding thread, a vertical wire segment, a winding wire segment, and a wire end. The bonding threads of the first bonding wires are bonded to the electrodes of the chips. The bonding threads of the first boding wires are integrally connected to the corresponding vertical wire segment and are integrally connected to the wire ends via the winding wire segments. The wire ends are bonded to the dummy spacer. Thereafter, an encapsulant is formed on the temporary carrier plate. The encapsulant encapsulates the chip stack, the dummy spacer, the alignment structure, and the first bonding wires. The encapsulant is grinded and a portion of each of the first bonding wires is removed to form a plurality of second bonding wires. The grinded encapsulant has a flat surface located at a different level than the active surface of the second chip. A plurality of polished cross-sectional surfaces of the second bonding wires and the alignment structure are coplanarly exposed by the flat surface. Then, a redistribution layer structure is formed on the flat surface. The redistribution layer structure includes a plurality of fan-out circuits, a first passivation layer, and a second passivation layer. The first passivation layer covers the flat surface and exposes the polished cross-sectional surfaces of the second bonding wires and the alignment structure. The fan-out circuits are formed on the first passivation layer and are connected to the polished cross-sectional surfaces of the second bonding wires and the alignment structure via openings of the first passivation layer. The second passivation layer is formed on the first passivation layer and covers the fan-out circuits. Lastly, the temporary carrier plate is removed.

Through the above technical means, the disclosure is able achieve the application of an ultra-thin fan-out wafer-level package process in which the substrate thickness is neglected. The overall package thickness is very close to the chip stack height and may be in a range not exceeding 100 micrometers. Moreover, the disclosure may also be applied in a panel-level package process. The disclosure may further be incorporated as a ball-grid array (BGA) package type. The stacking, wiring, and encapsulating of the chips are introduced in the wafer-level or panel-level packaging process before the redistribution layer is formed to render an ultra-thin package structure. Therefore, other than the differences in the carrier and the formation of the redistribution layer, the chip disposition, wiring bonding, and encapsulation step may all adopt existing packaging techniques. Furthermore, with the aid of the alignment structure, the manufacturing precision may be further enhanced, thereby increasing the yield of the package.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

In the following, embodiments of the disclosure are described in detail with reference to figures. However, it should be mentioned that, the figures are all simplified schematics showing the basic structure or implementation of the disclosure in an illustrative manner. Therefore, only components and combinations pertinent to the present application are shown, and the components shown in the figures are not drawn to scale in terms of the number, shape, and size of actual implementation. Certain size ratios and other relating size ratios are exaggerated or simplified to provide a clearer description. The number, shape, and size ratio of actual implementation are open designs, and the detailed component layout may be more complicated.

Figure 1A:
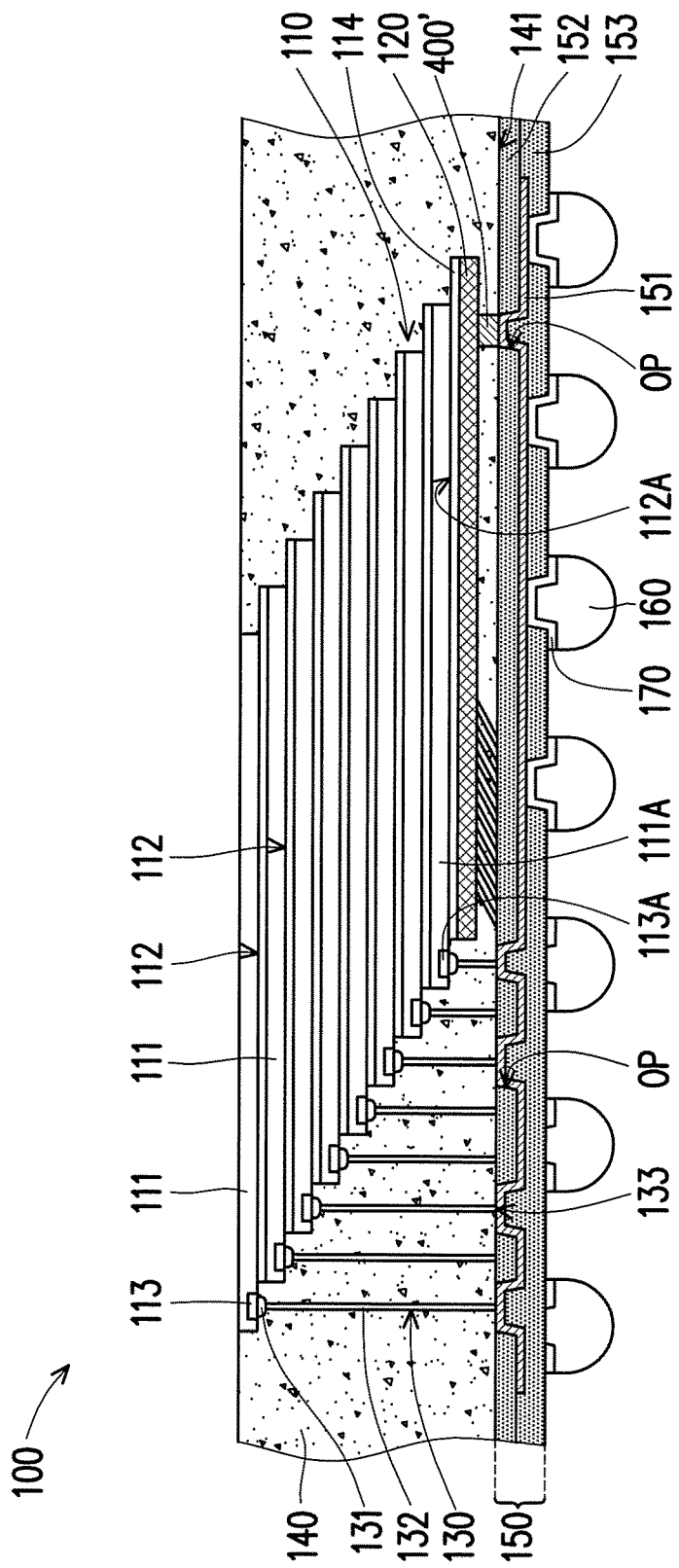
FIG. 1A is a cross-sectional view of a thin fan-out multi-chip stacked package structure according to a first embodiment of the disclosure.
Figure 1B:
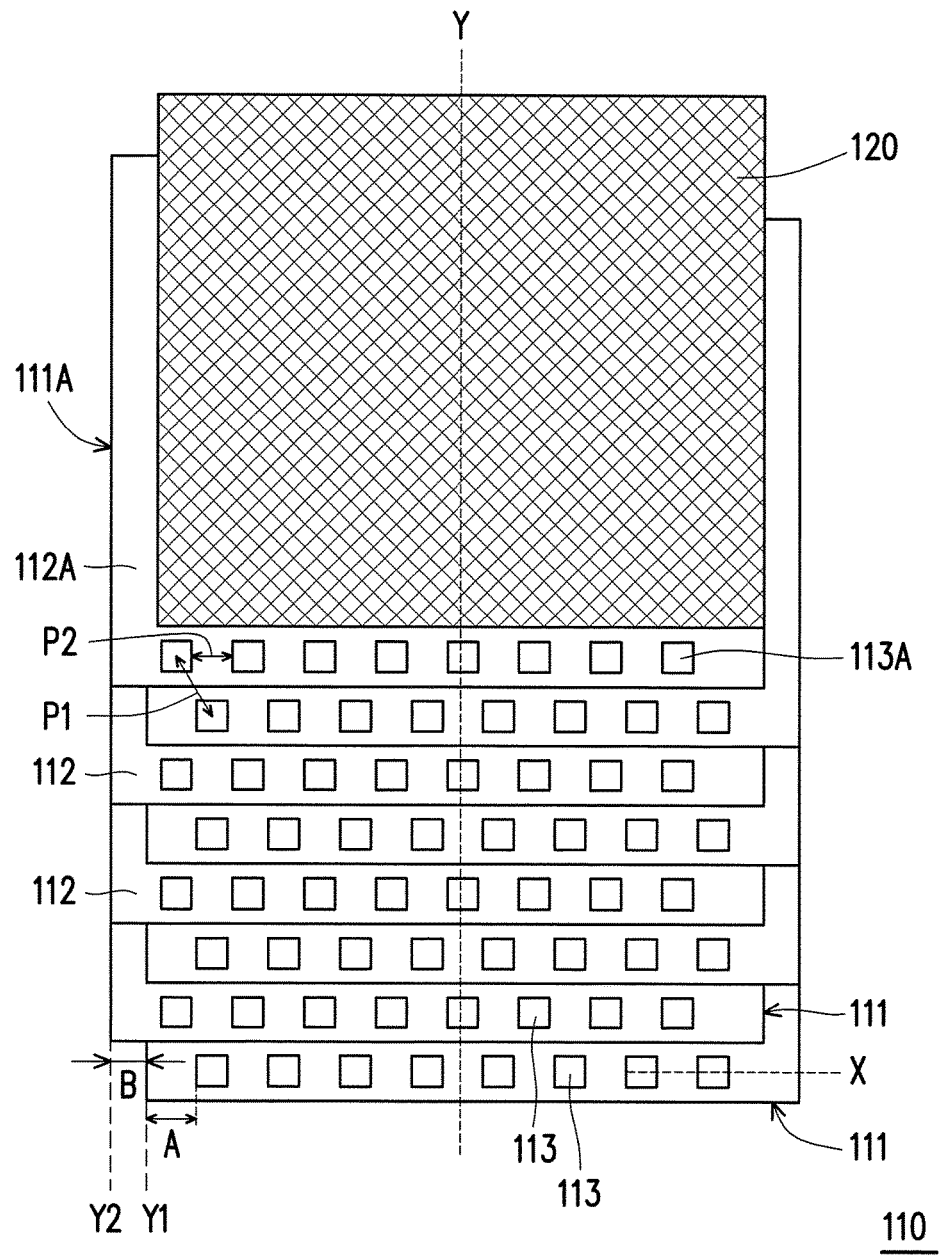
FIG. 1B is a schematic top view of a chip stack in the thin fan-out multi-chip stacked package structure according to the first embodiment of the disclosure.
Figure 1C:
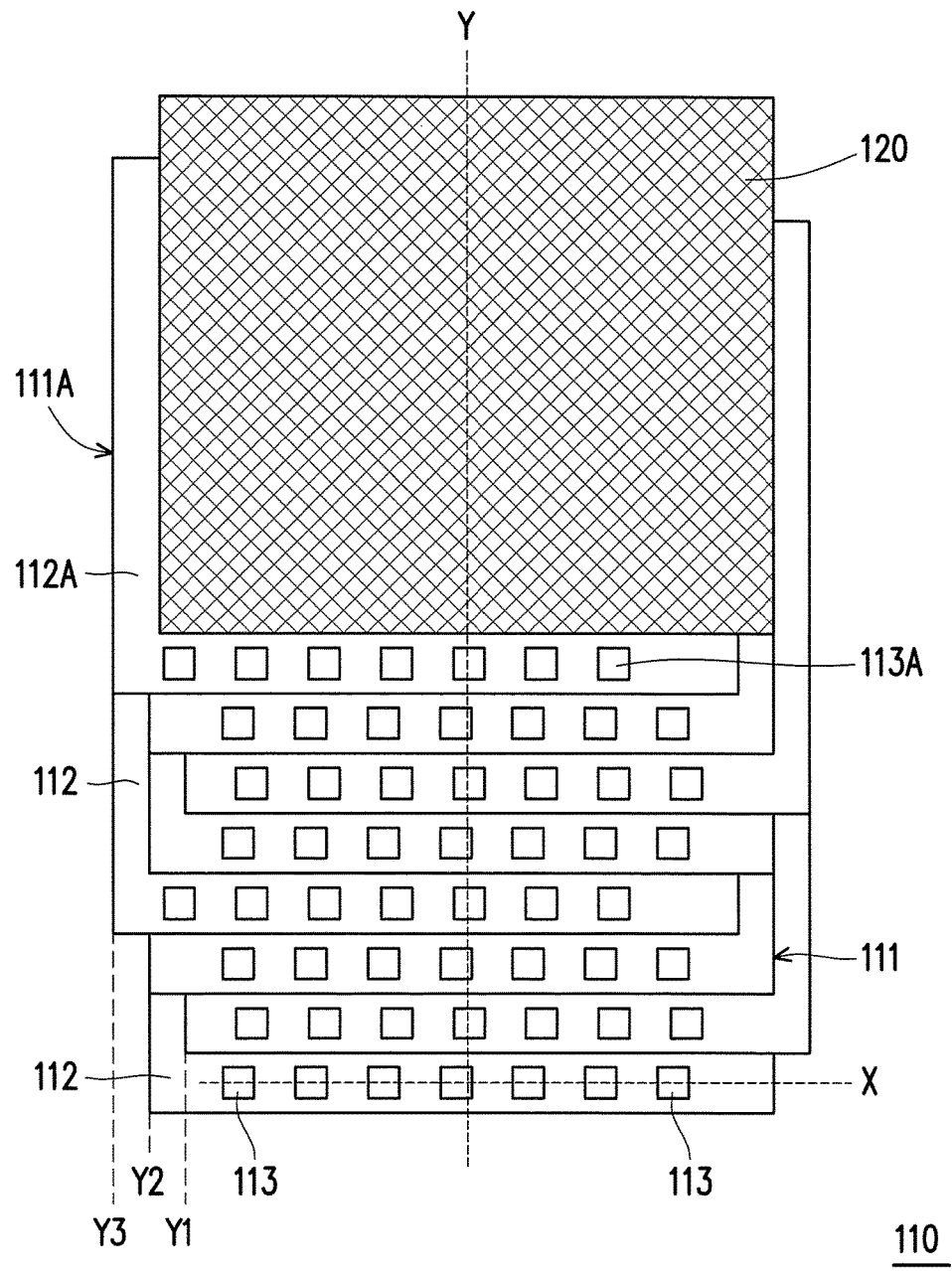
FIG. 1C is an alternative schematic top view of a chip stack in the thin fan-out multi-chip stacked package structure according to the first embodiment of the disclosure.

According to a first embodiment of the disclosure, FIG. 1A illustrates a cross-sectional view of a thin fan-out multi-chip stacked package structure 100. FIG. 1B illustrates a schematic top view of a chip stack 110 in the thin fan-out multi-chip stacked package structure according to the first embodiment of the disclosure. FIG. 1C illustrates an alternative schematic top view of a chip stack 110 in the thin fan-out multi-chip stacked package structure according to the first embodiment of the disclosure. FIGS. 2A to 2J illustrate the cross-sectional views of the thin fan-out multi-chip stacked package structure 100 during each step of the manufacturing process. FIGS. 3A and 3B are three-dimensional views of the thin fan-out multi-chip stacked package structure 100 during singulation/cutting step. The thin fan-out multi-chip stacked package structure 100 includes a chip stack 110, a dummy spacer 120, an alignment structure 400', a plurality of bonding wires 130, an encapsulant 140, and a redistribution layer structure 150.

Referring to FIG. 1A, the chip stack 110 is formed by a plurality of chips 111 and 111A. The chips 111 and 111A are IC semiconductor devices with memory units. The chips 111 and 111A are divided into at least one first chip 111 and a second chip 111A stacked below the first chip(s) 111. Each of the first chips 111 has an active surface 112 and at least one electrode 113 located on the active surface 112. The second chip 111A has an active surface 112A and at least one electrode 113A located on the active surface 112A. When the chips 111 and 111A are stacked with each other, the active surfaces 112 of the first chips 111 are partially covered. The electrodes 113 of the first chips 111 are exposed by the second chip 111A. In some embodiments, the electrodes 113 of the first chips 111 and the active surface 112A of the second chip 111A are not stacked or covered by the chips 111. The active surfaces 112 and 112A include integrated circuit formed thereon, and the electrodes 113 and 113A are electrically connected to a metal interconnect (not shown) of the integrated circuits inside the chips 111 and 111A. A chip attachment layer 114 may be formed on the back of each of the chips 111 and 111A for adhering the active surface 112 of adjacent chip 111, so as to form the chip stack 110. About 60% to 90% of the area of the adhered active surface 112 is covered by the chip attachment layer 114. The number of the stacked chips 111 and 111A may be four or more, and in the present embodiment, eight chips are stacked. The chips 111 and 111A may be stacked in a manner of a ladder, a cross, or a tower. For example, in the present embodiment, the chips 111 and 111A may be stacked in a ladder offset manner such that the electrodes 113 and 113A are exposed by other chips 111 and 111A in the chip stack 110. The electrodes 113 and 113A may include a plurality of bonding pads. When all of the active surfaces 112 face a same direction, one active surface (the active surface 112A of the second chip 111A) is not stacked or covered by the chips 111 and 111A.

Referring to FIG. 1B, the configuration of the chip stack 110 will be explained in detail herein. As illustrated in FIG. 1B, seven first chips 111 and one second chip 111A are stacked on top of each other to from the chip stack 110. From bottom to top, the first chips 111 are respectively labelled as $1^{st}$ to $7^{th}$ first chips 111. A sidewall of at least one of the first chip 111 is not aligned with a sidewall of the second chip 111A. For example, as illustrated in FIG. 1B, the sidewalls of the odd number first chips ($1^{st}$, $3^{rd}$, $5^{th}$, and $7^{th}$) 111 are aligned with a line Y1 while the sidewalls of the even number first chips ($2^{nd}$, $4^{th}$, $6^{th}$) 111 and the sidewall of the second chip 111A are aligned with a line Y2. In other words, the first chips 111 and the second chip 111A are stacked in a staggered manner. It should be noted that the number of the chips in FIG. 1B merely serves as an exemplary illustration and the disclosure is not limited thereto. In some alternative embodiments, more or fewer chips may be adapted to form the chip stack 110. The electrode 113 located on the first chip 111 and the electrode 113A located on the second chip 111A have a minimum distance of P1 therebetween. The two adjacent electrodes 113A located on the second chip 111A have a minimum distance of P2 therebetween. In some embodiments, the minimum distance P1 is greater than the minimum distance P2. Referring to FIG. 1B, a Y-axis base line Y passes through center of the bottommost first chip ($1^{st}$ first chip) 111. The electrodes 113 are arranged along an X-axis base line X that is perpendicular to the Y-axis base line Y. As illustrated in FIG. 1B, the electrode 113 on the $1^{st}$ first chip 111 and the sidewall of the $1^{st}$ first chip 111 have a minimum distance A therebetween. On the other hand, the sidewall of the $1^{st}$ first chip 111 and the sidewall of the $2^{nd}$ first chip 111 have a minimum distance B therebetween. In some embodiments, the minimum distance A is greater than the minimum distance B. For example, the minimum distance A may be approximately 150 μm while the minimum distance B may range between 60 μm to 120 μm.

As illustrated in FIG. 1B, the electrodes 113 on the odd number first chips 111 and the electrodes 113 on the even number first chips 111 are alternatively arranged. Similarly, the electrodes 113 on at least one of the first chips 111 (for example, the $1^{st}$, $3^{rd}$, $5^{th}$, and $7^{th}$ first chips 111) and the electrodes 113A on the second chip 111A are also alternatively arranged. Based on this configuration, the shift of the chip stack 110 may be effectively controlled, and the pitch between electrodes 113/electrodes 113A of different chips 111 and 111A may be enlarged. It should be noted that the first chips 111 and the second chip 111A not only arrange alternatively in the X-direction, but also arrange alternately in the Y-direction.

Other than the arrangement illustrated in FIG. 1B, the chip stack 110 may adapt other configurations. For example, the chip stack 110 may have the arrangement illustrated in FIG. 1C. Referring to FIG. 1C, the sidewalls of the $2^{nd}$ and $6^{th}$ first chips 111 are aligned with a line Y1, the sidewalls of the $1^{st}$, $3^{rd}$, $5^{th}$, and $7^{th}$ first chips 111 are aligned with a line Y2, and the sidewall of the $4^{th}$ first chip 111 and the sidewall of the second chip 111A are aligned with a line Y3. Based on this configuration, the shift of the chip stack 110 may be effectively controlled, and the pitch between electrodes 113/electrode 113A of different chips 111 and 111A may be enlarged.

Referring to FIG. 1A again, the dummy spacer 120 is disposed on the active surface 112A of the second chip 111A. At least one electrode 113A of the second chip 111A is exposed by the dummy spacer 120. In some embodiments, the dummy spacer 120 can be selected from one of a dummy chip or a heat-dissipating metal plate, so the dummy spacer 120 is suitable for pick-and-place operations with good heat-dissipating effect. The size and thickness of the dummy spacer 120 may be less than or equal to the unit sizes and unit thicknesses of the chips 111 and 111A. "Dummy chip" refers to a semiconductor substrate having a similar shape or appearance as that of a chip while not having IC active devices formed therein. In some embodiments, the dummy spacer 120 may be grinded and partially sacrificed. The dummy spacer 120 is able to provide a spacer function to prevent damage to the active surface 112A (not stacked or covered) of the second chip 111A from grinding. Moreover, the dummy spacer 120 further includes the function of stabilizing the bonding wires 130 to alleviate the issue of wire sweep during encapsulation process.

The alignment structure 400' is disposed over the dummy spacer 120 on a side opposite to the second chip 111A. The alignment structure 400' may be formed by a plating process. The plating process is, for example, electro-plating, electroless-plating, immersion plating, or the like. The alignment structure 400' includes metal. For example, the alignment structure 400' may be made of copper, gold, silver, tin, etc. The alignment structure 400' may take the form of a post, a bump, or a ball. The shape of the alignment structure 400' is not limited as long as such structure is able to serve as an alignment mark during the manufacturing process of the redistribution layer structure 150.

Each of the bonding wires 130 has a bonding thread 131 and a vertical wire segment 132. The bonding threads 131 of the bonding wires 130 are bonded to the electrodes 113 and 113A of the chips 111 and 111A and are integrally connected to the corresponding vertical wire segment 132. The length of the vertical wire segments 132 is complementary to the stack height of the bonded chips. That is, the greater the stack height of the chips 111 and 111A is, the smaller the length of the vertical wire segments 132 of the bonding wires 130 bonded to the corresponding electrodes is. The bonding wires 130 have a plurality of exposed polished cross-sectional surfaces 133 formed by grinding process after encapsulation process. The bonding wires 130 do not have the conventionally known tangent extrusion marks of vertical bonding wires cut off in mid-air. A material of the bonding wires 130 may be gold or copper.

Referring to FIG. 1A again, the encapsulant 140 encapsulates the chip stack 110, the dummy spacer 120, the alignment mark 400', and the bonding wires 130. The encapsulant 140 is a thermosetting insulating material such as an insulating resin or a molding epoxy compound. The encapsulant 140 has a flat surface 141 and the flat surface 141 is located at a level height different from the active surface 112A of the second chip 111A. The plurality of polished cross-sectional surfaces 133 of the bonding wires 130 and the alignment structure 400' are coplanarly exposed by the flat surface 141. In general, a distance between the flat surface 141 and the active surface 112A (not stacked or covered) of the second chip 111A is substantially equal to a sum of thicknesses of the dummy spacer 120 and the polished alignment structure 400'. Therefore, the effect in which the flat surface 141 and a specified active surface (i.e., the active surface 112A of the second chip 111A) are in close proximity but are not stacked horizontally may be achieved.

Referring to FIG. 1A, the redistribution layer structure 150 is formed on the flat surface 141. The redistribution layer structure 150 may be formed by using the alignment structure 400 as an alignment mark. For example, an optical alignment process may be performed while forming the redistribution layer structure 150 by adapting the alignment structure 400 as the alignment mark. The redistribution layer structure 150 includes a plurality of fan-out circuits 151, a first passivation layer 152, and a second passivation layer 153. The first passivation layer 152 covers the flat surface 141 but exposes the polished cross-sectional surfaces 133 and the alignment structure 400 through a plurality of openings OP. The fan-out circuits 151 are formed on the first passivation layer 152 and are connected to the polished cross-sectional surfaces 133 of the bonding wires 130 and the alignment structure 400 via openings OP of the first passivation layer 152. The second passivation layer 153 is formed on the first passivation layer 152 and covers the fan-out circuits 151. Therefore, the fan-out circuits 151 are not required to be directly formed on the flat surface 141. The redistribution layer structure 150 is different from a circuit layer of a known substrate, and is made by semiconductor deposition, electroplating, and etching processes. The fan-out circuits 151 may be a multi-layer metallic structure such as Ti/Cu/Cu or Ti/Cu/Cu/i/Au, etc. The first copper layer is thinner (about 0.2 micrometers) and is formed by deposition, and the second copper layer is thicker (about 3 micrometers) and is formed by electroplating. In other words, the fan-out circuits 151 may include a combination of a bonding layer, a seed layer, and an electroplating layer. The thickness of the fan-out circuits 151 may be set to 10 micrometers or less, such as between approximately 2 micrometers and approximately 6 micrometers. The first passivation layer 152 and the second passivation layer 153 may be an organic insulating layer such as polyimide (PI). Each of the thicknesses of the first passivation layer 152 and the second passivation layer 153 may be approximately 5 micrometers. Therefore, the redistribution layer structure 150 may be superior to the known substrate circuit layer in terms of smaller thickness and circuit density. When openings are formed in the passivation layer, the metallic layer having high coverage formed by deposition may be electrically connected to the bottommost redistribution layer. As a result, not only the number of the circuit layer may be reduced, the requirement of plated through hole in the substrate may also be omitted.

Referring to FIG. 1A again, the thin fan-out multi-chip stacked package structure 100 may further include a plurality of external terminals 160. The external terminals 160 may be bonded to the redistribution layer structure 150 to electrically connect with the fan-out circuits 151. When the external terminals 160 are solder balls, a ball-grid array (BGA) package type may be achieved. Preferably, a plurality of terminal bearings 170 may be disposed between the external terminals 160 and the fan-out circuits 151 to strengthen the bonding of the external terminals 160 and the fan-out circuits 151. The terminal bearings 170 may include under-bump metallization (UBM) and may be formed by materials such as Ni or Cu.

Based on the above, the thin fan-out multi-chip stacked package structure provided by the disclosure is able to alleviate the issue of wire sweep of vertical bonding wires in a specific package type during encapsulation process. Moreover, the alignment structure is able to sufficiently enhance the alignment precision of the redistribution layer structure. Therefore, the fabrication of the thin fan-out multi-chip stacked package structure would result in better stability and yield.

The manufacturing method of the thin fan-out multi-chip stacked package structure 100 is described with FIG. 2A to FIG. 2J below.

Figure 2A:
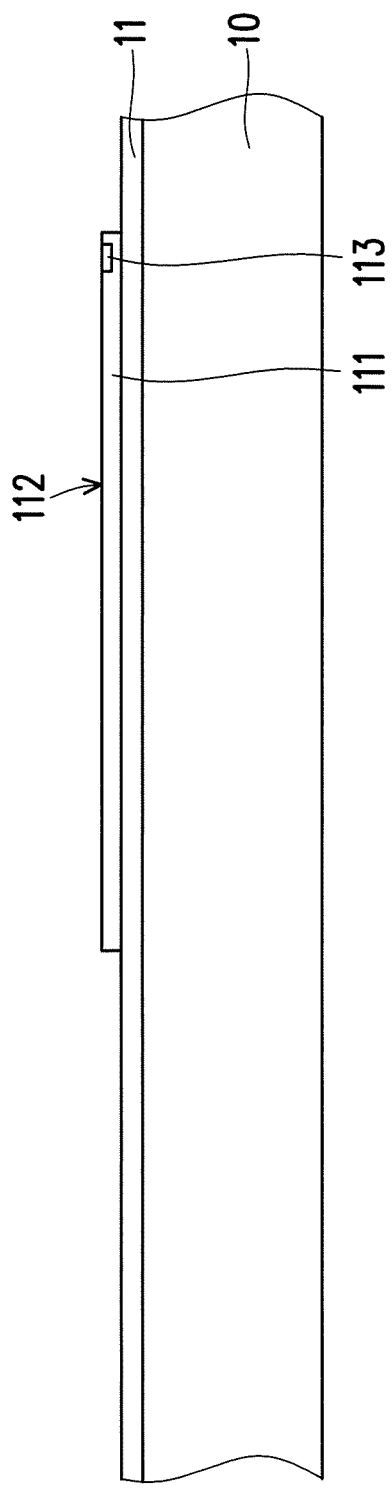
FIG. 2A to FIG. 2J are cross-sectional views of the thin fan-out multi-chip stacked package structure during each step of the manufacturing process according to the first embodiment of the disclosure.
Figure 2B:
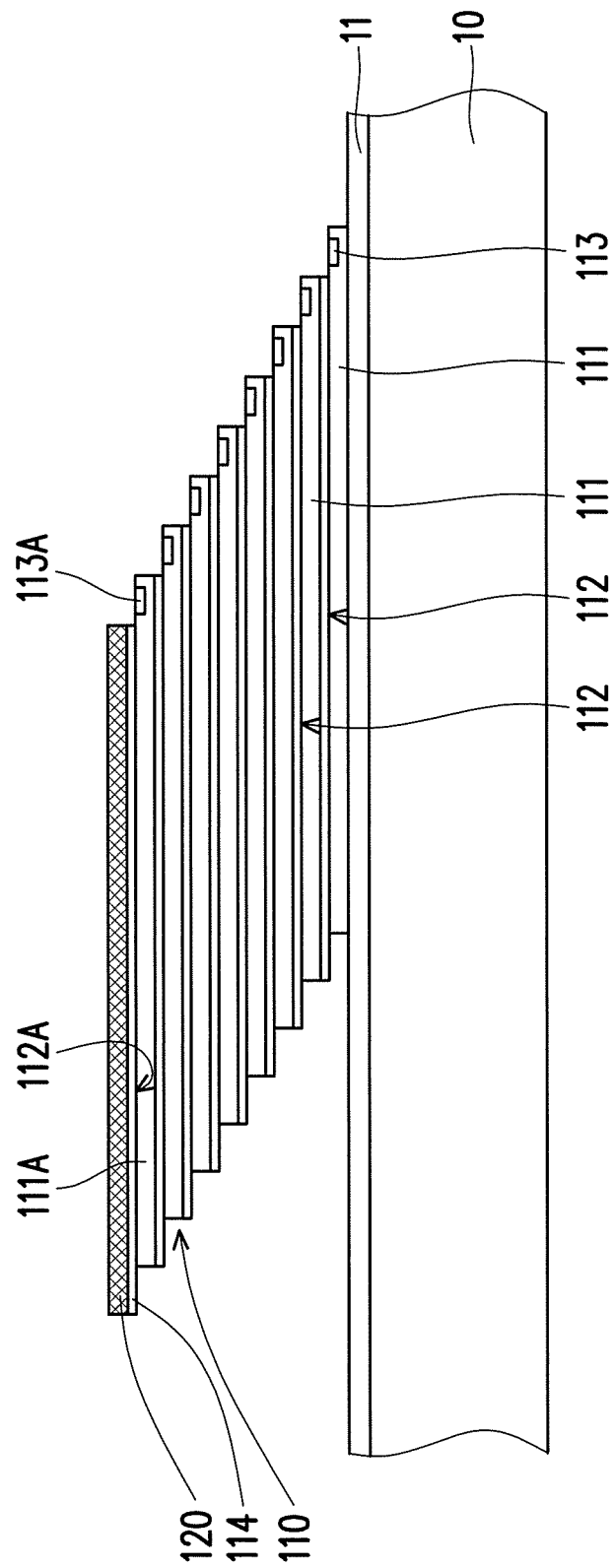
Figure 3A:
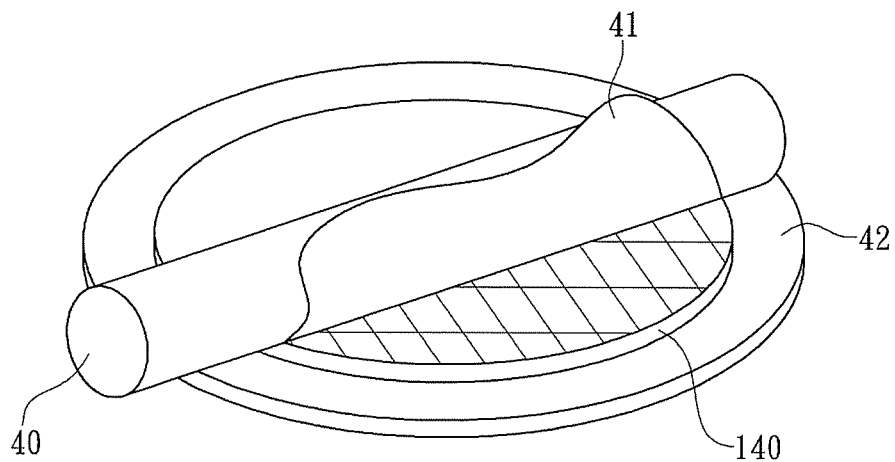
FIG. 3A and FIG. 3B are three-dimensional views of the thin fan-out multi-chip stacked package structure during singulation/cutting step according to the first embodiment of the disclosure.
Figure 3B:
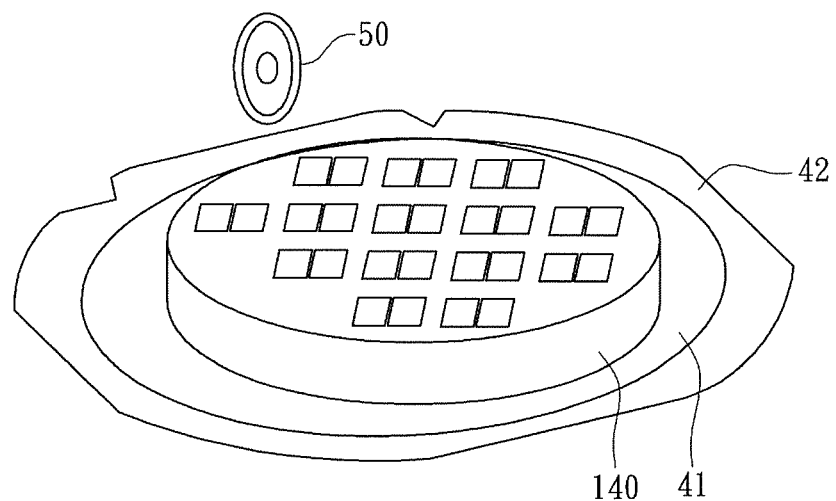

First, referring to FIG. 2A and FIG. 2B, a plurality of chips 111 and 111A are disposed on a temporary carrier plate 10 one by one by pick-and-place method. A release layer 11 such as an UV adhesive gel may be pre-fabricated on a surface of the temporary carrier plate 10. After UV irradiation, the release layer 11 loses adhesivity and may be readily peeled off from the temporary carrier plate 10. The temporary carrier plate 10 may be a wafer support system (WSS) or a panel support system (PSS), or even a sticky film fixed by a positioning ring. A material for the body of the temporary carrier plate 10 may be silicon or glass. The shape of the temporary carrier plate 10 may be a wafer or a panel.

Next, referring to FIG. 2B, after sufficient number of chips are stacked upward, a chip stack 110 on the temporary carrier plate 10 is provided. The chip stack 110 is formed by stacking at least one first chips 111 and a second chip 111A. Each of the first chips 111 has an active surface 112 and at least one electrode 113 located on the active surface 112. The second chip 111A has an active surface 112A and at least one electrode 113A located on the active surface 112A. After the chips 111 and 111A are stacked, the active surfaces 112 of the first chips 111 may be partially covered, but the electrodes 113 of the first chips 111 are exposed by the second chip 111A. In some embodiments, the electrodes 113 and 113A and the active surface 112A of the second chip 111A are not stacked or covered by the chips 111. A chip attachment layer 114 may be formed on the back of each of the chips 111 and 111A to adhere the active surfaces 112 of adjacent first chips 111. In particular, the chips 111 and 111A are stacked in a ladder offset manner such that the electrodes 113 and 113A are exposed by other chips 111 and 111A in the chip stack 110. The electrodes 113 and 113A may include a plurality of bonding pads. Moreover, a dummy spacer 120 is disposed on the active surface 112A of the second chip 111A. At least one electrode 113A of the second chip 111A is not covered by the dummy spacer 120. The dummy spacer 120 is selected from one of a dummy chip or a metal plate.

Figure 2C:
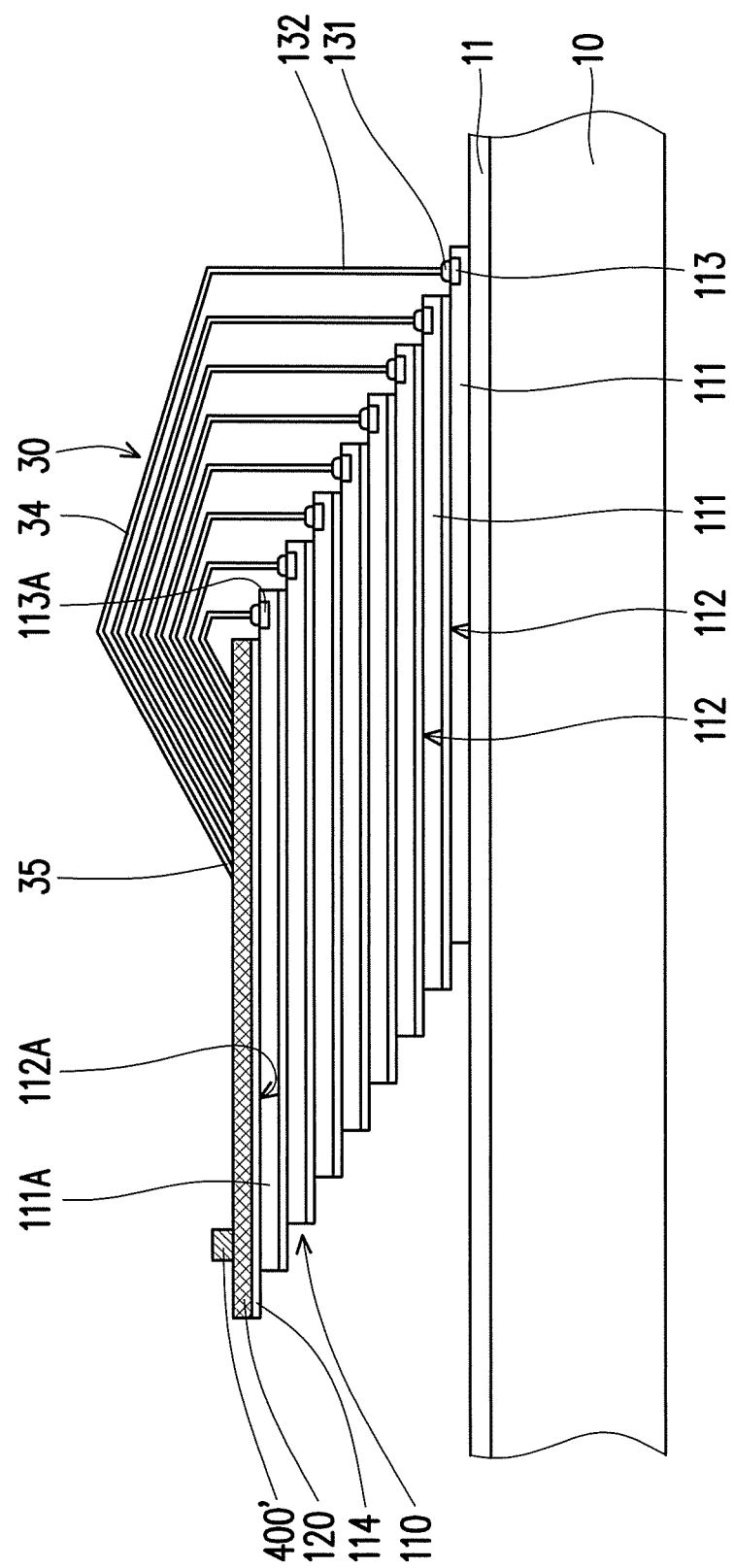

Next, referring to FIG. 2C, an alignment structure 400' and a plurality of first bonding wires 30 are formed. The alignment structure 400' is formed on the dummy spacer 120. The alignment structure 400' may be formed by a plating process. The plating process is, for example, electroplating, electroless-plating, immersion plating, or the like. The alignment structure 400' includes metal such as copper, gold, silver, tin, etc. The alignment structure 400' may take the form of a post, a bump, or a ball.

The first bonding wires 30 connected between the chip stack 110 and the dummy spacer 120 are formed via wiring bonding method. Each of the bonding wires 30 has a bonding thread 131, a vertical wire segment 132, a winding wire segment 34, and a wire end 35. The bonding threads 131 of the bonding wires 30 are bonded to the electrodes 113 and 113A of the chips 111 and 111A and are integrally connected to the corresponding vertical wire segment 132. The bonding threads 131 of the bonding wires 30 are also integrally connected to the wire ends 35 via the winding wire segments 34. The wire ends 35 are bonded to the dummy spacer 120. In other words, both ends of each of the first bonding wires 30 are bonded and there is no cut off in mid-air. Therefore, the bonding wires 30 have better resistance against encapsulation impact. Moreover, the bonding wires 30 have a wire arc height greater than the level height of the dummy spacer 120, and are defined by the winding wire segments 34. Therefore, the winding wire segments 34 protrude beyond the horizontal plane of the dummy spacer 120.

Figure 2D:
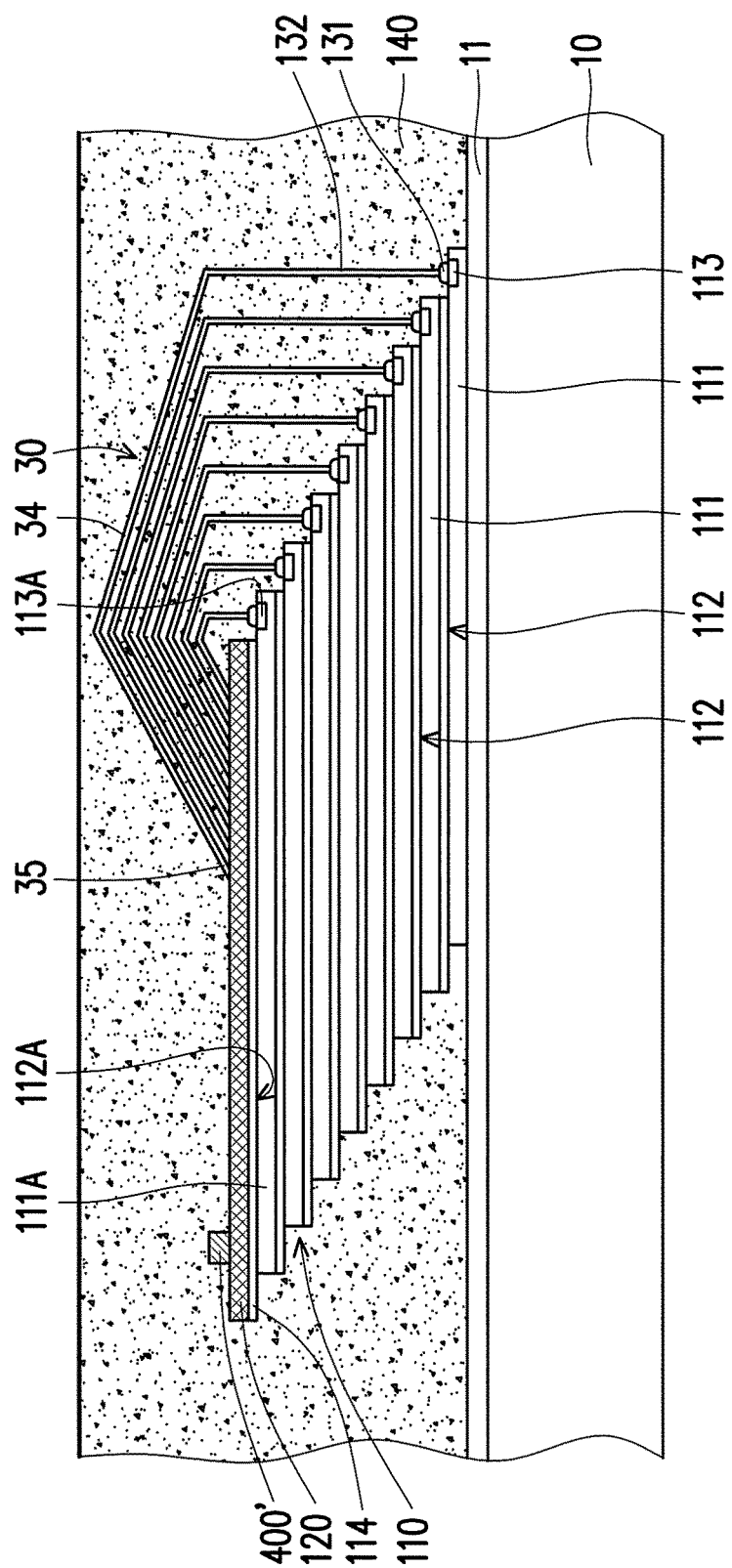

Next, referring to FIG. 2D, an encapsulant 140 is formed on the temporary carrier plate 10 via transfer molding or compression molding. The encapsulant 140 encapsulates the chip stack 110, the dummy spacer 120, the alignment structure 400', and the bonding wires 30. The encapsulation thickness of the encapsulant 140 is greater than the wire arc height of the bonding wires 30 measured from the temporary carrier plate 10. In the present step, the bonding wires 30, the alignment structures 400', and the dummy spacer 120 may be completely encapsulated by the encapsulant 140.

Figure 2E:
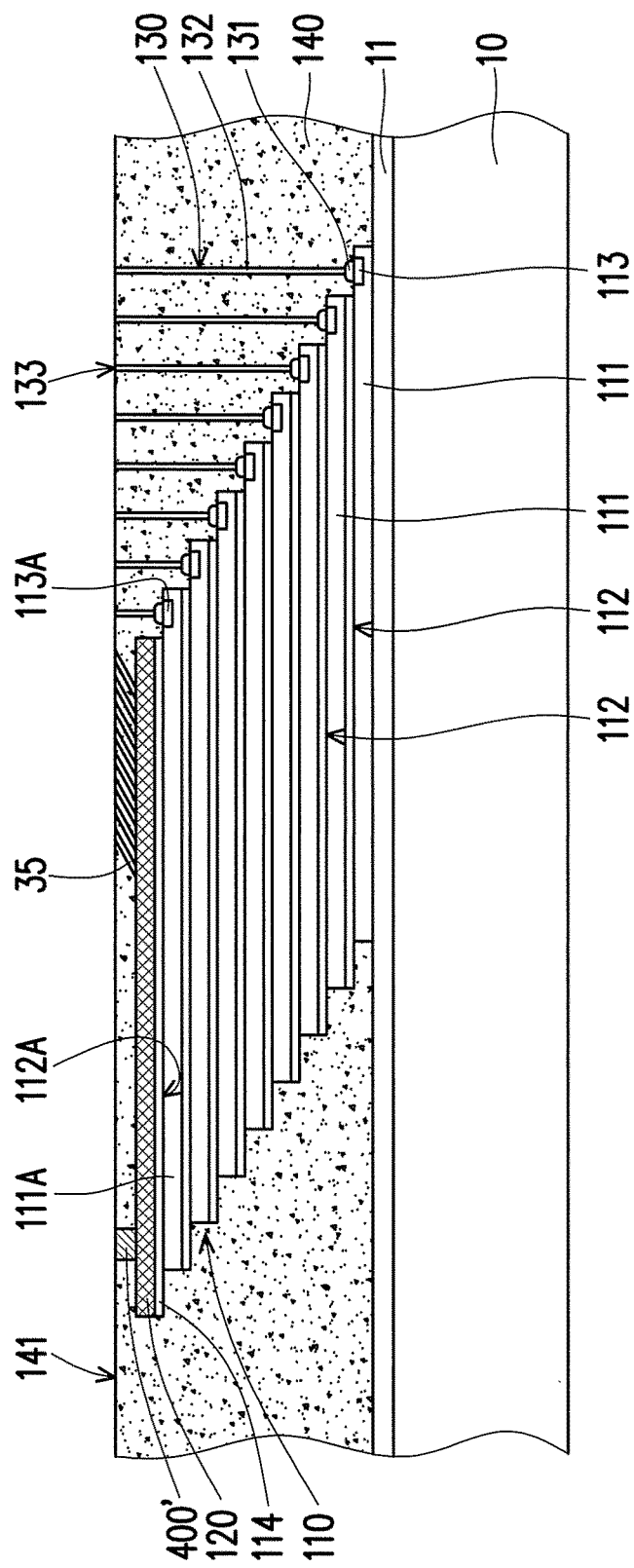

Next, referring to FIG. 2E, mechanical polishing or chemical polishing is performed via wafer polishing or panel polishing to grind the encapsulant 140, such that the encapsulant 140 has a flat surface 141. The flat surface 141 is not coplanar with the active surface 112A of the second chip 111A. Moreover, the flat surface 141 is also not coplanar with the dummy spacer 120. A portion of each of the first bonding wires 30 are removed to form bonding wires 130. In some embodiments, the winding wire segments 34 of the first bonding wires 30 are removed such that the vertical wire segments 132 are disconnected from the wire ends 35.

As such, each of the bonding wires 130 includes the bonding thread 131 and the vertical wire segment 132. It should be noted that the wire ends 35 are electrically insulated from the bonding wires 130, so the residues of wire ends 35 would not affect the electrical property of the thin fan-out multi-chip stacked package structure 100. The plurality of polished cross-sectional surfaces 133 of the bonding wires 130 and the alignment structure 400' are coplanarly exposed by the flat surface 141. The alignment structure 400' may be used as a buffer layer for grinding depth. A portion of (but not all of) the alignment structure' 400 may be grinded to further reduce the overall thickness. The alignment structure 400' may serve as an alignment mark in the subsequent processes.

Figure 2F:
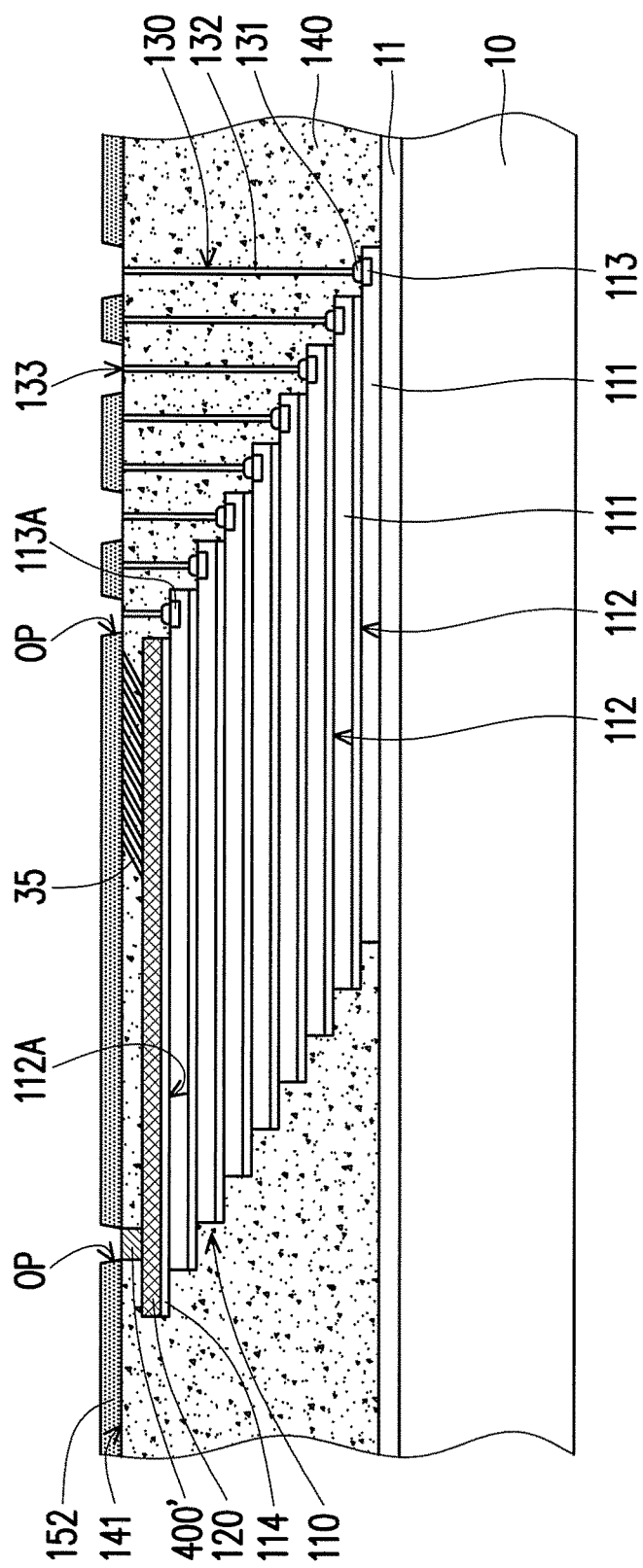
Figure 2G:
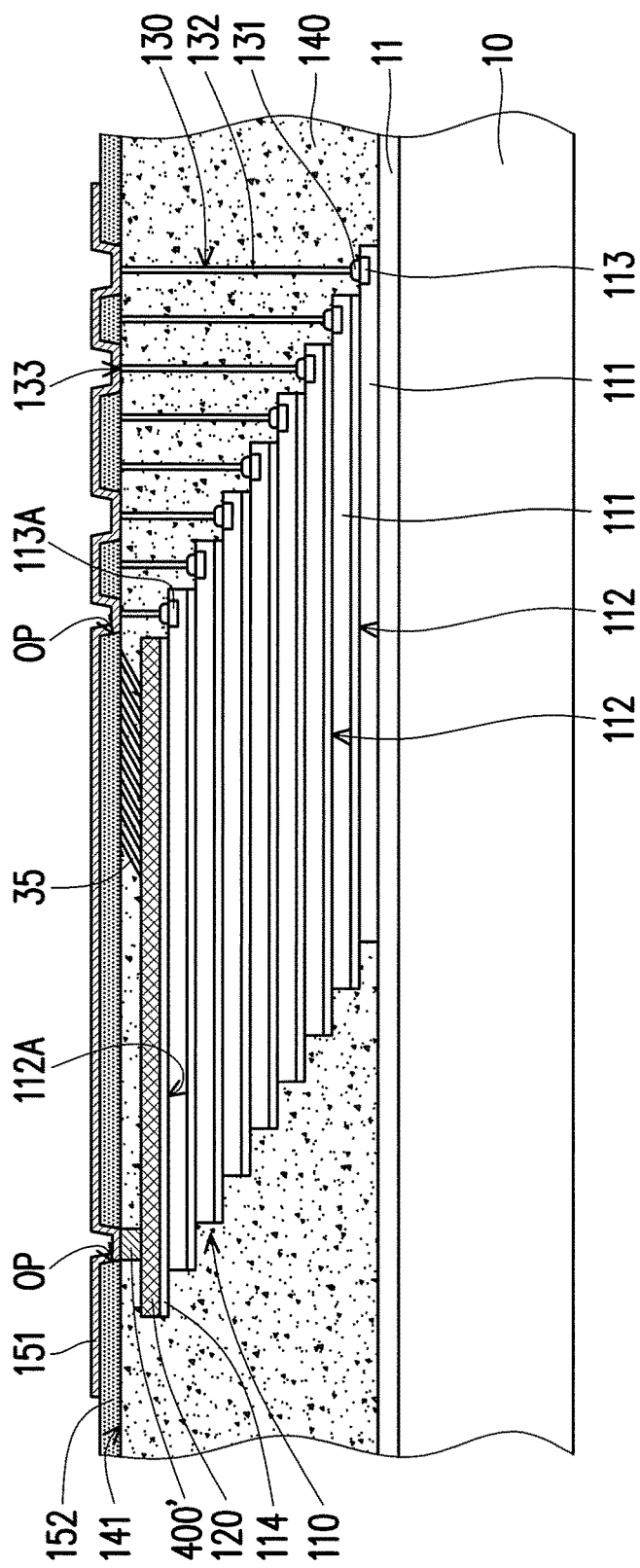
Figure 2H:
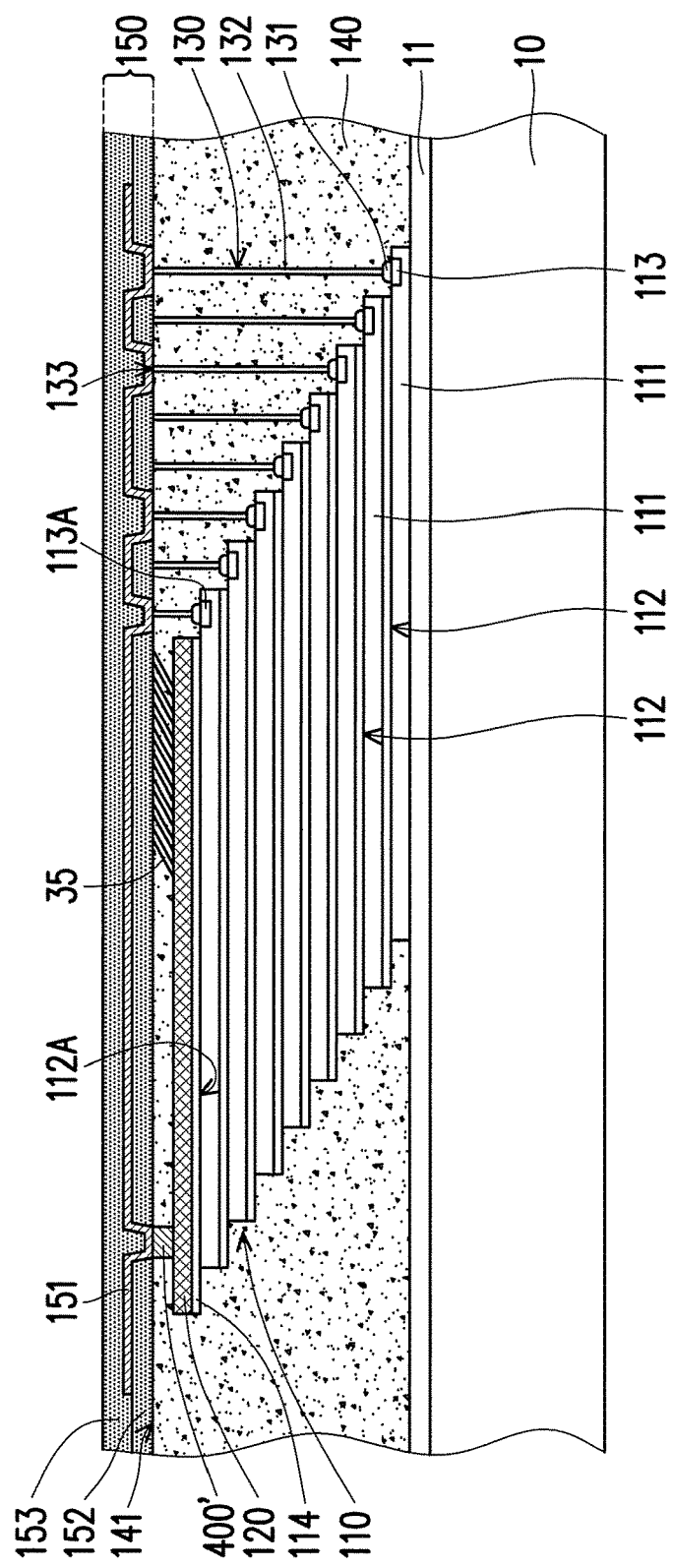

Next, referring to FIG. 2F to FIG. 2H, a redistribution layer structure 150 is formed on the flat surface 141. The redistribution layer structure 150 may be formed by using the alignment structure 400' as an alignment mark. For example, an optical alignment process may be performed while forming the redistribution layer structure 150 by adapting the alignment structure 400' as alignment mark. The redistribution layer structure 150 includes a plurality of fan-out circuits 151, a first passivation layer 152, and a second passivation layer 153. In FIG. 2F, the first passivation layer 152 is formed on the flat surface 141. The first passivation layer 152 is patterned to form a plurality of openings OP. The openings OP expose the polished cross-sectional surfaces 133 and at least a portion of the bonding wires 130. In some embodiment, the alignment structure 400' may also be exposed by the openings OP of the first passivation layer 152 according to the design requirement. In FIG. 2G, The fan-out circuits 151 are formed on the first passivation layer 152 and are connected to the polished cross-sectional surfaces 133 of the bonding wires 130 and the alignment structure 400' via the openings OP of the first passivation layer 152. In FIG. 2H, the second passivation layer 153 is formed on the first passivation layer 152 and covers the fan-out circuits 151.

Figure 2I:
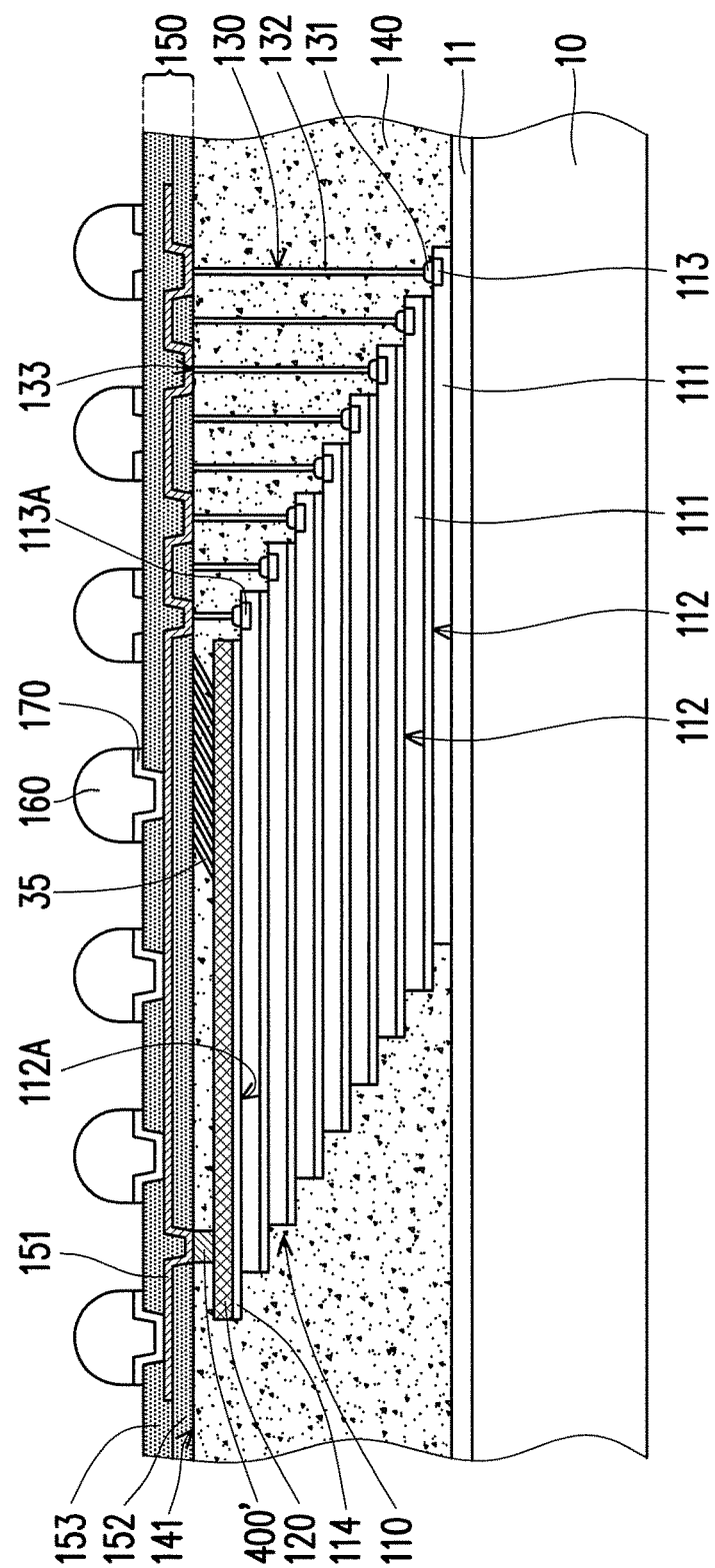
Figure 2J:
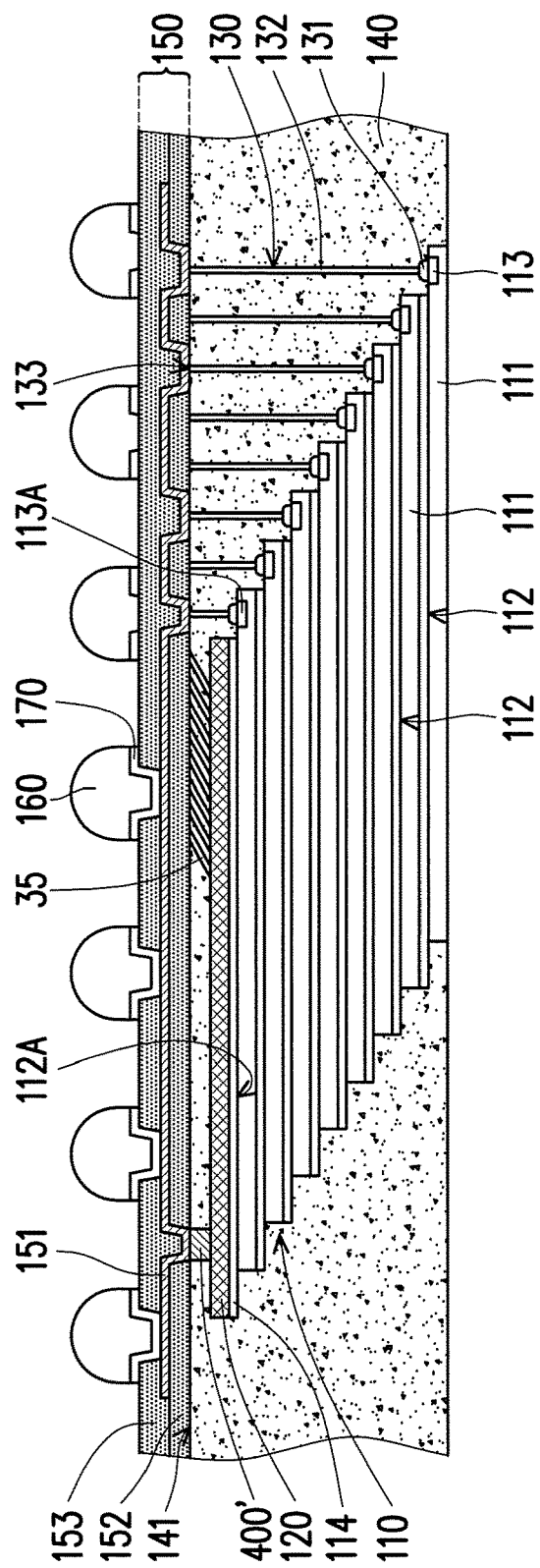

Next, referring to FIG. 2I, a plurality of external terminals 160 may be bonded to the redistribution layer structure 150 to electrically connect with the fan-out circuits 151. A plurality of terminal bearings 170 may be disposed between the external terminals 160 and the fan-out circuits 151 to strengthen the bonding of the external terminals 160 and the fan-out circuits 151. Next, referring to FIG. 2J, the temporary carrier plate 10 is removed, and the shape of the encapsulant 140 may be that of a packaged wafer or a packaged panel (as shown in FIG. 3A).

FIG. 3A and FIG. 3B are three-dimensional views of the thin fan-out multi-chip stacked package structure 100 during singulation/cutting step. Referring to FIG. 3A, in a positioning step before cutting, a cutting film 41 is laminated onto the encapsulant 140 by a lamination stick 40. The periphery of the cutting film 41 is fixed onto a positioning ring 42. Therefore, a surface of the encapsulant 140 opposite to another surface in which the external terminals 160 are bonded is exposed for laser marking. The surface of the encapsulant 140 for laser marking may expose the back of the bottommost stacked chip (as shown in FIG. 3B). Referring to FIG. 3B, in a singulation/cutting step, an isolation cutter 50 is used to cut the laser-marked surface of the encapsulant 140 along a predefined scribe line of the encapsulant 140 to form a plurality of the thin fan-out multi-chip stacked package structure 100.

Figure 4:
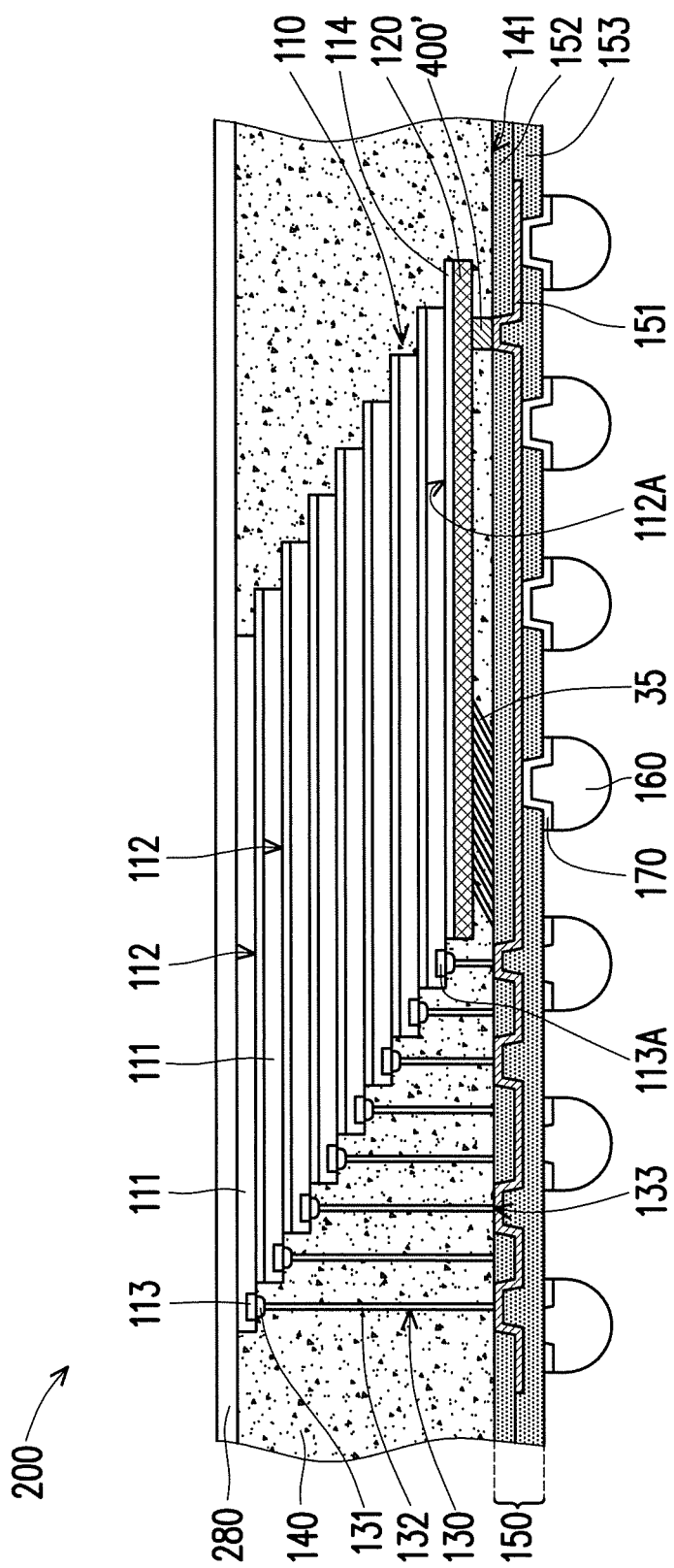
FIG. 4 is a cross-sectional view of another thin fan-out multi-chip stacked package structure according to a second embodiment of the disclosure.

According to a second embodiment of the disclosure, FIG. 4 illustrates a cross-sectional view of another thin fan-out multi-chip stacked package structure 200. In particular, the same reference numerals are used for the components having the same function in the second embodiment as that of the first embodiment and the details are not repeated herein. The difference between the first embodiment and the second embodiment lies in that in the second embodiment, the thin fan-out multi-chip stacked package structure 200 further includes a cladding layer 280.

In the present embodiment, a formation surface of the encapsulant 140 opposite to the flat surface 141 is the surface which exposes the back of the bottommost stacked chip 111. A cladding layer 280 is formed on the formation surface of the encapsulant 140 to prevent exposure of the back of the chip. The cladding layer 280 may be an organic insulating layer to provide resistance against stress generated during formation of the redistribution layer structure 150, thereby achieving balance in package warpage. Moreover, the cladding layer 280 may also be a thermally-conductive layer.

Figure 5:
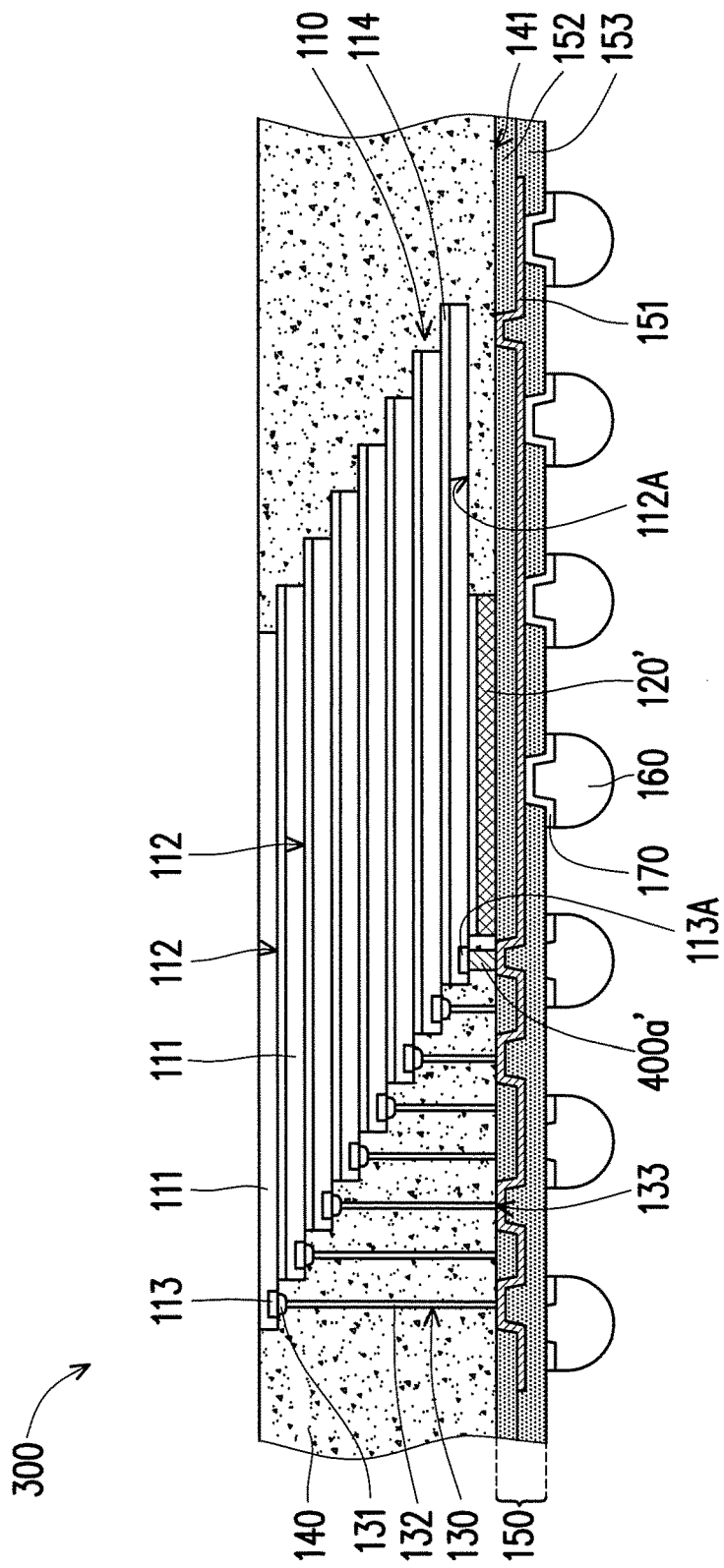
FIG. 5 is a cross-sectional view of yet another thin fan-out multi-chip stacked package structure according to a third embodiment of the disclosure.

According to a third embodiment of the disclosure, FIG. 5 illustrates a cross-sectional view of yet another thin fan-out multi-chip stacked package structure 300. In particular, the same reference numerals are used for the components having the same function in the third embodiment as that of the first embodiment and the details are not repeated herein. The difference between the first embodiment and the third embodiment lies in that in the third embodiment, the dummy spacer 120' and the alignment structure 400a' are located on a same level height.

As illustrated in FIG. 5, the dummy spacer 120' is formed on the active surface 112A of the second chip 111A and the alignment structure 400a' is formed on the electrode 113A located on the active surface 112A of the second chip 111A. As illustrated in FIG. 5, the dummy spacer 120' is adjacent to the alignment structure 400'. In some embodiments, a length of the dummy spacer 120' is shorter than a length of the second chip 111A such that the dummy spacer 120' exposes at least part of the active surface 112A of the second chip 111A. However, the size of the dummy spacer 120' is not limited thereto. In some alternative embodiments, the size of the dummy spacer 120' in the third embodiment may be identical to the size of the dummy spacer 120 in the first embodiment.

Referring to FIG. 5, the bonding wires 130 are not formed on the second chip 111A. Instead, the alignment structure 400a' is formed on the electrode 113A of the second chip 111A to electrically connect the second chip 111A and the redistribution structure 150. In other words, in the third embodiment, the alignment structure 400a' not only serves as an alignment mark, but also yield the function of electrical connection. Since the dummy spacer 120' and the alignment structure 400a' are located on a same level height, the overall thickness of the thin fan-out multi-chip stacked package structure 300 may be further reduced.

Figure 6:
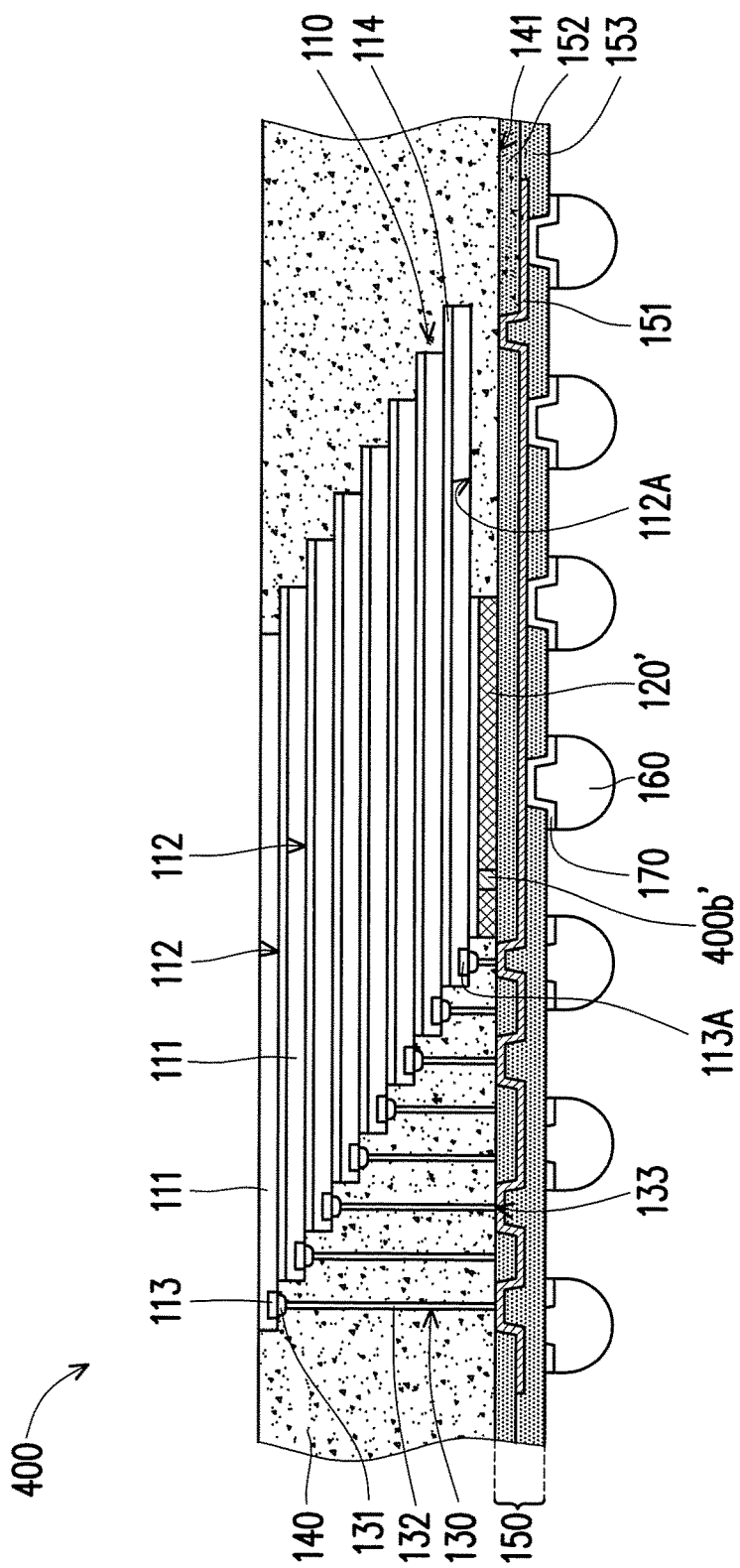
FIG. 6 is a cross-sectional view of another thin fan-out multi-chip stacked package structure according to a fourth embodiment of the disclosure.

According to a fourth embodiment of the disclosure, FIG. 6 illustrates a cross-sectional view of another thin fan-out multi-chip stacked package structure 400. In particular, the same reference numerals are used for the components having the same function in the fourth embodiment as that of the third embodiment and the details are not repeated herein. The difference between the third embodiment and the fourth embodiment lies in that in the fourth embodiment, the alignment structure 400b' is embedded in the dummy spacer 120'.

As illustrated in FIG. 6, the dummy spacer 120' and the alignment structure 400b' are both formed on the active surface 112A of the second chip 111A. In some embodiments, a length of the dummy spacer 120' is shorter than a length of the second chip 111A such that the dummy spacer 120' exposes at least part of the active surface 112A of the second chip 111A. However, the size of the dummy spacer 120' is not limited thereto. In some alternative embodiments, the size of the dummy spacer 120' in the fourth embodiment may be identical to the size of the dummy spacer 120 in the first embodiment.

Referring to FIG. 6, since the dummy spacer 120' and the alignment structure 400b' are located on a same level height, the overall thickness of the thin fan-out multi-chip stacked package structure 400 may be further reduced.

The content disclosed above only includes the preferred embodiments of the disclosure, and therefore the scope of the disclosure is not limited thereto. As a result, modifications based on the claims of the disclosure yielding the same effect are covered in the scope of the disclosure.

What is claimed is:

1. A thin fan-out multi-chip stacked package structure, comprising:
   a chip stack formed by stacking a plurality of chips, wherein each of the chips has an active surface and at least one electrode located on the active surface, at least one electrode of a first chip is exposed by a second chip;
   a dummy spacer disposed on an active surface of the second chip, wherein at least one electrode of the second chip is exposed by the dummy spacer;
   an alignment structure over the active surface of the second chip;
   a plurality of bonding wires, wherein each of the bonding wires has a bonding thread and a vertical wire segment, and the bonding threads of the bonding wires are bonded to the electrodes of the chips and are integrally connected to the corresponding vertical wire segment;
   an encapsulant encapsulating the chip stack and the bonding wires, wherein the encapsulant has a flat surface, and a plurality of polished cross-sectional surfaces of the bonding wires and the alignment structure are coplanarly exposed by the flat surface; and
   a redistribution layer structure formed on the flat surface, wherein the redistribution layer structure comprises a plurality of fan-out circuits, a first passivation layer, and a second passivation layer, the first passivation layer covers the flat surface and exposes the polished cross-sectional surfaces of the bonding wires and the alignment structure, the fan-out circuits are formed on the first passivation layer and are connected to the polished cross-sectional surfaces of the bonding wires and the alignment structure via openings of the first passivation layer, and the second passivation layer is formed on the first passivation layer and covers the fan-out circuits.

2. The thin fan-out multi-chip stacked package structure of claim 1, further comprising a plurality of external terminals connected to the redistribution layer structure to electrically connect with the fan-out circuits.

3. The thin fan-out multi-chip stacked package structure of claim 1, wherein the chips are stacked in the manner of a ladder, a cross, or a tower.

4. The thin fan-out multi-chip stacked package structure of claim 3, wherein a sidewall of the first chip and a sidewall of the second chip are not aligned, and the at least one electrode on the first chip and the at least one electrode on the second chip are arranged alternately.

5. The thin fan-out multi-chip stacked package structure of claim 1, wherein the alignment structure is disposed on the dummy spacer.

6. The thin fan-out multi-chip stacked package structure of claim 1, wherein the alignment structure is directly in contact with the second chip.

7. The thin fan-out multi-chip stacked package structure of claim 6, wherein the alignment structure is disposed on the electrode of the second chip.

8. The thin fan-out multi-chip stacked package structure of claim 1, wherein the alignment structure is embedded in the dummy spacer.

9. The thin fan-out multi-chip stacked package structure of claim 1, wherein the dummy spacer is a dummy chip or a metal plate.

10. The thin fan-out multi-chip stacked package structure of claim 1, wherein the alignment structure comprises metal.

11. The thin fan-out multi-chip stacked package structure of claim 1, wherein a length of the bonding wire connected between the first chip and the redistribution layer structure is greater than a length of the bonding wire connected between the second chip and the redistribution layer structure.

12. The thin fan-out multi-chip stacked package structure of claim 1, wherein the chip stack further comprises a plurality of chip attachment layer disposed between two adjacent chips.

13. The thin fan-out multi-chip stacked package structure of claim 1, further comprising a cladding layer disposed on a surface of the encapsulant.

14. A manufacturing method of a thin fan-out multi-chip stacked package structure, comprising:
   providing a chip stack on a temporary carrier plate, wherein the chip stack is formed by stacking a plurality of chips, each of the chips has an active surface and at least one electrode located on the active surface, at least one electrode of a first chip is exposed by a second chip;
   forming a dummy spacer and an alignment structure over an active surface of the second chip, wherein at least one electrode of the second chip is exposed by the dummy spacer;
   forming a plurality of first bonding wires connected between the chip stack and the dummy spacer, wherein each of the first bonding wires has a bonding thread, a vertical wire segment, a winding wire segment, and a wire end, the bonding threads of the first bonding wires are bonded to the electrodes of the chips, the bonding threads of the first boding wires are integrally connected to the corresponding vertical wire segment and are integrally connected to the wire ends via the winding wire segments, and the wire ends are bonded to the dummy spacer;
   forming an encapsulant on the temporary carrier plate, wherein the encapsulant encapsulates the chip stack, the dummy spacer, the alignment structure, and the first bonding wires;
   grinding the encapsulant and removing a portion of each of the first bonding wires to form a plurality of second bonding wires, wherein the grinded encapsulant has a flat surface located at a different level than the active surface of the second chip, a plurality of polished cross-sectional surfaces of the second bonding wires and the alignment structure are coplanarly exposed by the flat surface;
   forming a redistribution layer structure on the flat surface, wherein the redistribution layer structure comprises a plurality of fan-out circuits, a first passivation layer, and a second passivation layer, the first passivation layer covers the flat surface and exposes the polished cross-sectional surfaces of the second bonding wires and the alignment structure, the fan-out circuits are formed on the first passivation layer and are connected to the polished cross-sectional surfaces of the second bonding wires and the alignment structure via openings the first passivation layer, and the second passivation layer is formed on the first passivation layer and covers the fan-out circuits; and removing the temporary carrier plate.

15. The method of claim 14, further comprising bonding a plurality of external terminals on the redistribution layer structure to electrically connect with the fan-out circuits.

16. The method of claim 14, wherein the chips are stacked in the manner of a ladder, a cross, or a tower.

17. The method of claim 14, wherein the step of forming the dummy spacer and the alignment structure comprises:
    forming the dummy spacer on the active surface of the second chip; and
    forming the alignment structure on the dummy spacer.

18. The method of claim 14, wherein the step of forming the dummy spacer and the alignment structure comprises:
    forming the alignment structure on the electrode located on the active surface of the second chip; and
    forming the dummy spacer on the active surface of the second chip.

19. The method of claim 14, wherein the dummy spacer is a dummy chip or a metal plate.

20. The method of claim 14, wherein during the step of grinding the encapsulant, at least a portion of the alignment structure is grinded and the active surface of the second chip is not grinded.

21. The method of claim 14, further comprising forming a release layer between the chip stack and the temporary carrier plate.

22. The method of claim 14, further comprising forming a cladding layer on a surface of the encapsulant, wherein the cladding layer is an organic insulating layer or a thermally-conductive layer.

* * * * *